(12) United States Patent
Stanescu (10) Patent No.: US 9,391,571 B2
(45) Date of Patent: Jul. 12, 2016

(54) CHOPPER-STABILIZED AMPLIFIER AND METHOD THEREFOR

(71) Applicant: SEMICONDUCTOR COMPONENTS INDUSTRIES, LLC, Phoenix, AZ (US)

(72) Inventor: Cornel D. Stanescu, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 19 days.

(21) Appl. No.: 14/574,779

(22) Filed: Dec. 18, 2014

(65) Prior Publication Data

US 2015/0207477 A1     Jul. 23, 2015

Related U.S. Application Data

(60) Provisional application No. 61/929,408, filed on Jan. 20, 2014.

(51) Int. Cl.
*H03F 3/45* (2006.01)
*H03F 3/387* (2006.01)

(52) U.S. Cl.
CPC ............ *H03F 3/45475* (2013.01); *H03F 3/387* (2013.01); *H03F 2200/234* (2013.01); *H03F 2200/252* (2013.01); *H03F 2200/459* (2013.01); *H03F 2203/45138* (2013.01)

(58) Field of Classification Search
CPC .................................................. H03F 3/45892
USPC ....................................... 330/9; 327/124, 307
See application file for complete search history.

(56) References Cited

U.S. PATENT DOCUMENTS

| | | | | |
|---|---|---|---|---|
| 7,292,095 B2* | 11/2007 | Burt | ........................ | H03F 1/26 330/69 |
| 7,724,080 B2* | 5/2010 | Luff | ....................... | H03F 3/393 327/124 |
| 2016/0056707 A1* | 2/2016 | Wong | ..................... | H02M 1/14 323/217 |

OTHER PUBLICATIONS

Rod Burt et al., "A Micropower Chopper-Stabilized Operational Amplifier Using a SC Notch Filter With Synchronous Integration Inside the Continuous-Time Signal Path," IEEE Journal of Solid-State Circuits, 2006; 41(12):2729-2736.
Texas Instruments, Technical Data Sheet for OPA333, OPA2333—1.8-V, microPower, CMOS Operational Amplifiers, Zerio-Drift Series, 2006 (rev. 2013); SBO351D, 33 pages.
Cornel Stanescu et al., "Symmetrical passive RC notch filter with two cutoff frequencies for ripple reduction in chopper offset-stabilized amplifiers," Proceedings of CAS 2014 International Semiconductor Conference, IEEE Catalog No. CFP14CAS_PRT, ISBN: 978-1-4799-3916-9, pp. 215-218, Oct. 2014.

* cited by examiner

*Primary Examiner* — Henry Choe
(74) *Attorney, Agent, or Firm* — Robert F. Hightower (57) ABSTRACT

In one embodiment a chopper-stabilized amplifier may be formed to include a symmetrical passive RC notch filter having two cut-off frequencies. In an embodiment, the chopper stabilized amplifier may use only two clock signals to control the chopping operations.

18 Claims, 3 Drawing Sheets

CHOPPER-STABILIZED AMPLIFIER AND METHOD THEREFOR

PRIORITY CLAIM TO PRIOR PROVISIONAL FILING

This application claims priority to prior filed Provisional Application No. 61/929,408 entitled "CHOPPER-STABILIZED AMPLIFIER AND METHOD THEREFOR" filed on Jan. 20, 2014, and having common inventor Cornel D. Stanescu which is hereby incorporated herein by reference

BACKGROUND OF THE INVENTION

The present invention relates, in general, so electronics, and more particularly, to semiconductors, structures thereof, and methods of forming semiconductor devices.

Chopper stabilized amplifiers were previously used in various electronic applications. One example of a chopper stabilized amplifier was disclosed in U.S. Pat. No. 7,292,095. Some applications of chopper stabilized amplifiers used a four phase clock, that had four clock signals that were staggered in time. These prior chopper stabilized amplifiers often had excessive ripple or noise on the output and some had glitches on the output. For example, the operation resulting from the four phase clock system could result in a glitch in the output voltage for every transition of each phase of the four phase clock.

Accordingly, it may be desirable to form an integrated circuit chopper stabilized amplifier that reduces glitches and/or reduces ripple in the output. It may be desirable to have a chopper stabilized amplifier that has low noise, low-offset drift, good signal stability, or low current consumption.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element my a carry current in one direction through a device, such as carry current entering the device, and a second current carrying element may carry current in an opposite direction through the device, such as carry current leaving the device. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking, or in any other manner. It is to be understood that the terms so used are interchangeable under appropriate circumstances and that the embodiments described herein are capable of operation in other sequences than described or illustrated herein.

DETAILED DESCRIPTION OF THE DRAWINGS

Figure 1:
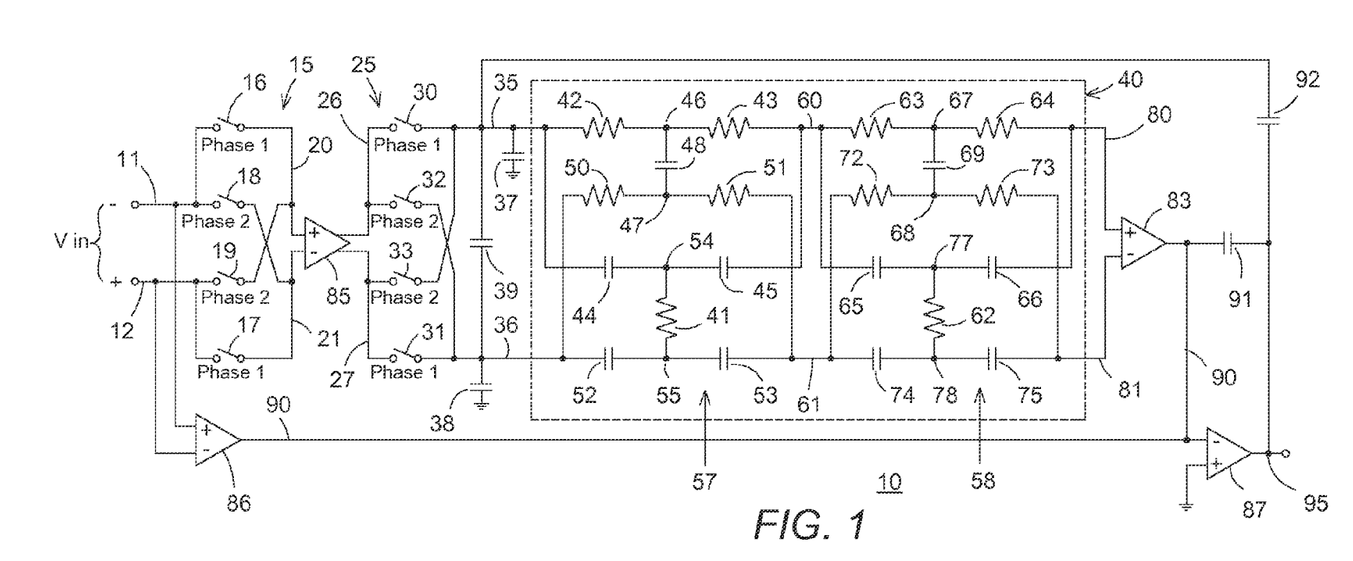
FIG. 1 schematically illustrates an example of an embodiment of a portion of a chopper-stabilized amplifier, in accordance with the present invention.

FIG. 1 schematically illustrates an example of an embodiment of a portion of a chopper-stabilized amplifier 10 that has reduced number of glitches and/or amplitude of glitches in the output signal. Amplifier 10 may include an input chopper circuitry or input, chopper circuit, or circuit 15, a first operational transconductance amplifier or amplifier 85, an output chopping circuitry or output chopper circuit or circuit 25, a passive RC symmetrical notch filter or filter 40, and a second operational transconductance amplifier or amplifier 83. Amplifier 10 may also include operational transconductance amplifiers 86 and 87. Amplifier 10 may include an inverting input conductor or inverting input or input 11 and a non-inverting input conductor or non-inverting input or input 12 by which amplifier 10 may receive an input signal Vin. Amplifier 10 may also include an output conductor or output terminal or output 95. Amplifier 10 may be configured to form an output signal Vout on output 95. First chopper circuit 15 may be configured to chop the input signal, Vin, and form a first chopped signal. Circuit 15 may also be configured to apply the first chopped signal, that is derived from the input signal Vin, to first operational transconductance amplifier 85. An embodiment of circuit 15 may include outputs connected to respective input conductors or input terminals or inputs 20 and 21 of amplifier 85. Amplifier 85 may also include output conductors or output terminals or outputs 26 and 27. Output chopper circuit 25 may be coupled to receive the output signal from amplifier 85. For example, circuit 25 may have inputs connected to outputs 26 and 27 to receive the output signal from amplifier 85. Circuit 25 may be configured to chop the output signal from amplifier 85 and form a second chopped signal. Those skilled in the art will understand that chopper circuits 15 and 25 may assist in reducing offsets voltages in the output of amplifier 85 and to reduce common mode voltages in the output signal of amplifier 85.

An embodiment of amplifier 10 may be configured to have at least two signal paths. A first signal path of amplifier 10 may include a three-stage high gain signal path through operational transconductance amplifiers 85, 83, and 87, and a second signal path of amplifier 10 may include a two-stage wideband width signal path through operational transconductance amplifiers 86 and 87.

Symmetrical notch filter 40 may include a first input 35 and a second input 36 that are configured to receive the second chopped signal from circuit 25. An embodiment of amplifier 10 may include a compensation capacitor 39 connected between inputs 35 and 36 of filter 40. Filter 40 may also include first and second output conductors or outputs 80 and 81, respectively. Outputs 80 and 81 may be respectively connected to a non-inverting input and an inverting input of amplifier 83.

An embodiment of circuit 15 may include switches 16 and 18 each having a first terminal connected to inverting input 11, and switches 19 and 17 each having a first terminal connected to non-inverting input 12. Switches 16 and 19 may also include a second terminal connected to input 20 of amplifier 85, such as for example a non-inverting input, and switches 18 and 17 may include a second terminal connected to input 21 of amplifier 85, such as for example an inverting input. Outputs 26 and 27 of amplifier 85 may be connected to inputs of output chopper circuit 25. Circuit 25 may include chopper switches 30 and 32 each having a first terminal connected to output 26, and chopper switches 33 and 31 each having a first, terminal connected to output 27. Switches 30 and 33 may also include a second terminal connected to input 35, and switches 32 and 31 may include a second terminal connected to input 36. The output of circuit 25 is applied to differential inputs 35 and 36 of filter 40. An embodiment may include that input 36 may be connected to one terminal of a compensation capacitor 38, the other terminal of which may be connected to ground. Input 35 may be connected to one terminal of a compensation capacitor 37, the other terminal of which may be connected to ground. A compensation capacitor 92 may have a first terminal connected to input 35 and the other terminal of capacitor 92 may be connected to output 95. In one embodiment, capacitor 37 may have a value that may be substantially identical with the value of capacitor 38.

In an embodiment, filter 40 may be configured to form a symmetrical capacitive load for the common-mode voltage provided between inputs 35 and 36 of filter 40. An embodiment may include that the symmetrical capacitive load of filter 40 may be for the differential voltage at inputs 35 and 36 or alternately for both the differential and common mode voltages. In another embodiment, filter 40 together with capacitors 37 and 38 may be configured to form a symmetrical capacitive load for the common-mode voltage provided between inputs 35 and 36. An embodiment may include that the symmetrical capacitive load for filter 40 and capacitors 37 and 38 may be for the differential voltage at inputs 35 and 36 or alternately for both the differential and common mode voltages. In another embodiment, filter 40 together with capacitors 37, 38, and 39 may be configured to form a symmetrical capacitive load for the common-mode voltage provided between inputs 35 and 36. An embodiment may include that the symmetrical capacitive load for filter 40 and capacitors 37, 38, and 39 may be for the differential voltage at inputs 35 and 36 or alternately for both the differential and common mode voltages.

In an embodiment, filter 40 may be configured to be symmetrical including symmetrical to a virtual ground. For example, section 57 may be symmetrical around a virtual ground such that the two signal paths connected to input 35 and connected between input 35 and the virtual ground, and such that the two signal paths connected to input 36 are connected between input 36 and the virtual ground. In an embodiment, filter 40 may be symmetrical by being configured to receive a differential input signal from the two outputs of circuit 25 and configured to provide a differential output signal between outputs 80 and 81.

In another embodiment, most of the compensation capacitors, except capacitor 91, may be relocated from inputs 35 and 36 of filter 40 to outputs 80-81. For example, compensation capacitor 92 may have the first terminal connected to output 80 and the other terminal may be connected to output 95, compensation capacitor 39 may be connected between outputs 80 and 81 of filter 40, compensation capacitor 37 may be connected between output 80 and a ground terminal, and compensation capacitor 38 may be connected between output 81 and the ground.

A balanced combination between the two described compensation capacitor networks may be formed within another embodiment, too, as a trade-off for certain electrical parameters such as: settling time, transient overshoot and undershoot, rise and tall time, unity gain bandwidth and phase margin.

Figure 2:
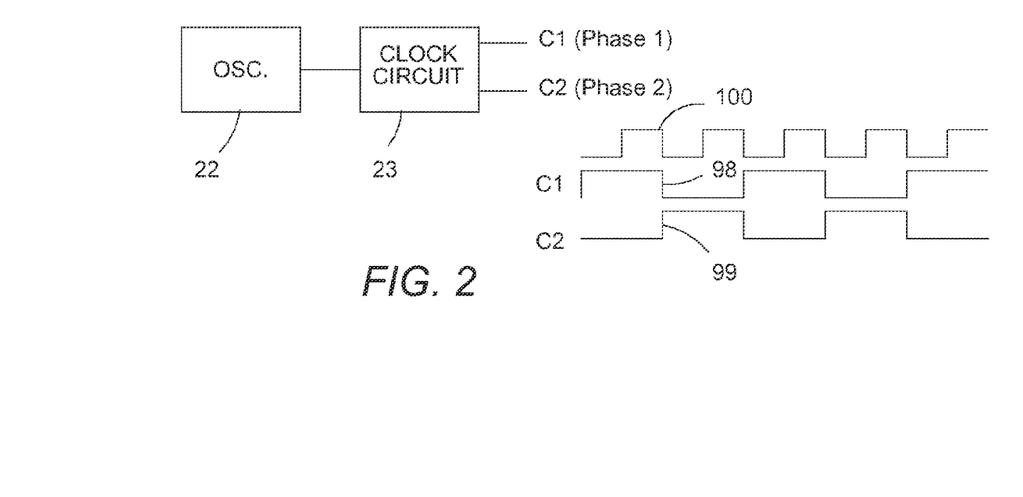
FIG. 2 illustrates in a general manner a block diagram embodiment of an example of a clock generation circuit and also includes a graph illustrating some signals that may be formed during the operation of the clock generator circuit in accordance with the present invention.

FIG. 2 illustrates in a general manner a block diagram embodiment of an example of a clock generation circuit and also includes a graph illustrating some signals that may be formed during the operation of the clock generator circuit. The clock generation circuit may include a main oscillator circuit or oscillator 22 and a clock circuit 23. In one embodiment, amplifier 10 may be configured to use only a two phase clock. For example, a single two phase clock may be used for operating circuits 15 and 25. An embodiment may include that no clock signal may be used for operating any of the elements of filter 40. For example, oscillator 22 may be configured to form a master clock signal. Circuit 23 may be configured to receive the main clock signal and form the two phase clock signals C1 and C2. A plot 100 illustrates the master clock signal from oscillator 22 that is used to form the synchronized two phase clock signals C1 and C2. A plot 98 illustrates a first clock signal (C1) of the two phase clock signals and a plot 99 illustrates a second clock signal (C2) of the two phase clock signals. In one embodiment, the first and second clock signals (C1 and C2) may be formed to have substantially the same frequency as each other and may be formed to be substantially opposite in phase. Signals C1 and C2 may have substantially fifty percent duty cycles in some embodiments. An embodiment may include that signals C1 and C2 have transitions substantially simultaneously. In other embodiments, signals C1 and C2 may not overlap but in other embodiments may have some overlap. Those skilled in the art will appreciate that in some embodiments there may be a short dead time between the asserted states of C1 and C2 to ensure that there is no overlap of the asserted states of the C1 and C2 signals. Those skilled in the art will appreciate that although the master clock signal is used to generate the C1 and C2 clock signals, the master clock signal is not used in operating amplifier 10, nor is the switching frequency of amplifier 10 the same as the frequency of the master clock signal. The C1 and C2 clock signals may be referenced to or derived from the master clock signal from oscillator 22 formed with amplifier 10 on a common semiconductor substrate.

Signals C1 and C2 may be used to control the various chopping switches as shown in FIG. 1. C1 may be configured to control switches 16, 17, 30, and 31, and C2 may be configured to control switches 18, 19, 32, and 33.

Referring back to FIG. 1, filter 40 may be formed to include a frequency response that includes a plurality of notches or cutoff frequencies. In one embodiment, filter 40 may be configured to form the notches approximately at harmonics of the chopping frequency (fs) of circuits 15 and 25, so that the notches may assist in suppressing the ripple voltages that can occur in a chopper-stabilized amplifier. The chopping frequency may be the frequency of either of clock signals C1 or C2. The amplitude of the ripple voltage as it appears at the input of filter 40, such as for example a triangle voltage waveform, may be related to the value of capacitor 39 and also to the chopping frequency fs. In an embodiment, filter 40 may be configured to include at least two-cutoff frequencies. An embodiment of filter 40 may be configured to filter not only the first harmonic or fundamental of the chopping frequency (fs) used to operate circuit 25 (or alternately the frequency fs used to operate circuits 15 and/or 25), but also at least one other harmonic of the chopping frequency used to operate circuit 25. In an embodiment, the other harmonic may be the third harmonic. An embodiment may include configuring filter 40 as a symmetrical passive RC notch filter. An embodiment may include configuring filter 40 with only passive components, such as for example with only resistors and capacitors. In an embodiment, filter 40 may be configured to operate without receiving a two phase clock signal. An embodiment of filter 40 may be configured to be devoid of clock signals used to operate any of the elements of filter 40. In an embodiment, amplifier 10 may be configured to operate with only a single two phase clock, such as for example a single two phase clock that is derived from a master clock. An embodiment may include that the chopping frequency may be correlated with the cut-off frequencies of filter 40 by forming the clock generation circuit that includes oscillator 22 and circuit 23 to include a current-driven oscillator and a bias circuit that are formed to use the same type of resistor as the resistors in filter 40. It has been found that filter 40 improves the stability of the output signal Vout formed on output 95 and reduces output glitches in the output signal Vout.

Filter 40 may also be configured to include multiple signal paths in an embodiment. An embodiment of filter 40 may be configured to include two sections, a first section 57 and a second section 58. Additionally, first section 57 may be configured to include multiple signal paths in an embodiment. For example, each input 35 or 36 may be connected to a first signal path made with resistors and to a second signal path made with capacitors. In an embodiment, input 35 may be connected to one signal path that includes series connected resistors 42 and 43, and to another signal path that includes series connected capacitors 44 and 45. Both of these signal paths may be reconnected together an a node 60. In an embodiment, node 60 may be configured as a first output or output of first section 57. Similarly, input 36 may be connected to a first signal path that includes series connected resistors 50 and 51, and to a second signal path that includes series connected capacitors 52 and 53. Both of these signal paths may be reconnected together at a node 61. In an embodiment, node 61 may be configured as a second output or output of first section 57. Thus, section 57 of filter 40 may have two resistor signal paths and two capacitor signal paths coming from inputs 35 and 36. Intermediate connections of the two resistor paths, such as for example at nodes 46 and 47, may be connected to a capacitor 48, while intermediate connections of the two capacitor paths, such as for example nodes 54 and 55, may be connected to a resistor 41. In an embodiment, the value of resistors 41-43 and 50-51 may be identical. Also, an embodiment may include that the value of capacitors 44-45, 48, and 52-53 may be identical. This may assist in providing good matching.

An embodiment of filter 40 may also include that second section 58 may also be configured to include multiple signal paths. An embodiment of second section 58 may be obtained by multiplying first section 57, connecting it in series, and changing only the values of the resistors.

An embodiment of second section 58 may include two resistor signal paths and two capacitor signal paths connected to the two inputs of section 58. In an embodiment, the two inputs of section 58 may be connected to respective outputs 60 and 61 of section 57. In an embodiment, second section 58 may include a first signal path and a second signal path connected to a first input of section 58, for example, such as to output 60 of first section 57. The first signal path may include series connected resistors 6 and 64 and the second signal path may include series connected capacitors 65 and 66. Both these signal paths may be reconnected together at output 80. In an embodiment, output 80 may be configured as a first output of second section 58. Also, an embodiment of the second input to section 58 may be connected both to a first signal path made with series connected resistors 72 and 73, and to a second signal path made with series connected capacitors 74 and 75. Both of these two signal paths from output 61 may be reconnected together at output 81. In an embodiment, output 81 may be configured as a second output of second section 58. The intermediate connections of the two resistors paths of section 58, such as for example nodes 67 and 68, may be connected to a capacitor 69, while the intermediate connections of the capacitor paths, such as for example nodes 77 and 78, may be connected to a resistor 62.

The value of resistors 62-64 and 72-73 may be substantially equal. Also, the value of capacitors 65-66, 69, and 74-75 may be substantially equal, and in one embodiment may also be substantially equal to the value of capacitors 44-45, 48, and 52-53.

Amplifier 10 may also include a feed-forward path that includes amplifier 86 and amplifier 87. In some embodiments, amplifier 87 may be configured as an operation amplifier. Input 12 of amplifier 10 may be connected to an inverting input of amplifier 86, and a non-inverting input of amplifier 86 may be connected to input 11 of amplifier 10. An output 90 of amplifier 86 may be commonly connected to an inverting input of amplifier 87, to an output of amplifier 83, and to a first terminal of compensation capacitor 91, the other terminal of which may be connected to output 95. A non-inverting input of amplifier 87 may be connected to ground. An output of amplifier 87 may be connected to output 95. The transconductance of amplifiers 85 and 83 are gm1 and gm2, respectively. The transconductance of amplifiers 87 and 86 are gm3 and gm4, respectively.

As expressed hereinbefore, an embodiment of filter 40 may be configured to have two cutoff frequencies. In an embodiment, the first cutoff frequency may be the chopping frequency used to operate circuit 25 (or alternately the frequency used to operate circuit 15) and the second cutoff frequency may be a harmonic of the chopping frequency. In an embodiment, the second cutoff frequency may be the third harmonic of the chopping frequency. For example, an embodiment of filter 40 may be configured to filter not only the first harmonic of the chopping frequency used to operate circuit 25 (or alternately the frequency used to operate circuit 15), such as for example the frequency of signals C1 and C2, but also at least one other harmonic of the chopping frequency used to operate circuit 25. Those skilled in the art will appreciate that the second cutoff frequency of filter 40 may be formed to be other harmonics other than the third harmonic. The second notch frequency may be other odd harmonics since the odd harmonics are believed to carry most of the energy, apart from the even harmonics. For example, the second notch frequency may be a fifth harmonic. However, in other embodiments, at least one of the cutoff frequencies may be an even harmonic. A formula for a cutoff frequency of filter 40 may be expressed as:

$$f_{cutoff}=1/(2\pi RC).$$

In an embodiment, the values of the resistors and capacitors in first section 57 may be selected to form the first cutoff frequency, and the values of the resistors and capacitors of second section 58 of filter 40 may be chosen for form the second cutoff frequency.

One non-limiting example embodiment may include that the frequency of the C1 and C2 signals, thus the chopping frequency, may be approximately one hundred twenty five kilo-Hertz (125 kHz). Those skilled in the art will understand that the explanation of this example embodiment of a 125 kHz chopping frequency is explained as vehicle to explain certain aspects and advantages of amplifier 10. However, the chopping frequency may have other values or be other frequencies in other embodiments. For example, higher frequencies may be easier to filer while lower frequencies may give certain improved performance. In some embodiments, the chopping frequency may be between approximately ten (10) kHz to approximately one (1) MHz in other embodiments. The actual value of the cutoff frequencies of filter 40 would change according to the frequency selected for the chopping frequency For the example embodiment of the 125 kHz chopping frequency, the first cutoff frequency is approximately the 125 kHz or chopping frequency itself. In this embodiment, the value of all the capacitors within filter 40 may be chosen to be approximately five (5) picofarads. This value may be high enough to minimize the parasitic capacitance influence, but also small enough to be easily integrated as a portion of semiconductor device formed on a semiconductor substrate. The value of capacitor 91 may have a value of approximately five (5) picofarads, capacitor 92 may have a value of approximately six (6) picofarads, and capacitor 39 may have a value of approximately eighteen (18) picofarads. The value of capacitor 92 may be optimized versus 91 for symmetrical error in processing the high-amplitude sinusoidal signal. Capacitors 38 and 37 may each have a value of approximately eighteen (18) picofarads. Those skilled in the art will appreciate that the capacitor values may be different in other embodiments.

For this non-limiting example embodiment, values of resistors 41-43, 50, and 51 used in first section 57 were calculated to be approximately 254.65 kilo ohms each in order to form the first cutoff frequency at the chopping frequency fs of approximately 125 kHz. To form the second cutoff frequency or second notch at the third harmonic, the value of resistors 62-6, 72, and 73 was calculated to be approximately 84.88 kilo ohms. Once the values of the passive devices within filter 40 are calculated, a simulation or other means can be used to evaluate the magnitude versus frequency of the differential transfer function of filter 40 which may be expressed in one embodiment, in dB or decibels, as:

$$|H_{40}|[dB]=20(\log|(V80-V81))/(V35-V36)$$

where:
|H$_{40}$| is the magnitude of the differential transfer function of filter 40,
V35–V36 is the differential input voltage to filter 40 between inputs 35 and 36, and
V80–V81 is the differential output voltage of filter 40 between outputs 80 and 81.

In one example embodiment, the obtained simulated cutoff frequencies may not be exactly the expected ones for the values used for the resistors and capacitors. For example in the above non-limiting example embodiment, the first cutoff frequency obtained from the simulation may be approximately 123.14 kHz and a higher 381.42 kHz for the second cutoff frequency. Thus, the real cutoff frequencies of the two series connected sections 57 and 58 of filter 40 may be both affected by an error of approximately −1.49% and approximately +1.71%, respectively. It is believed that these errors may be the result of mutual interaction.

In another non-limiting example embodiment, the value of resistors 41-43, 50, and 51 may be changed to a value of approximately 250.85 kilo ohms, while the value of resistors 62-64, 72, and 73 may be changed to approximately 86.33 kilo ohms. A simulation with these changed values illustrates an attenuation of the differential input signal.

Figure 3:
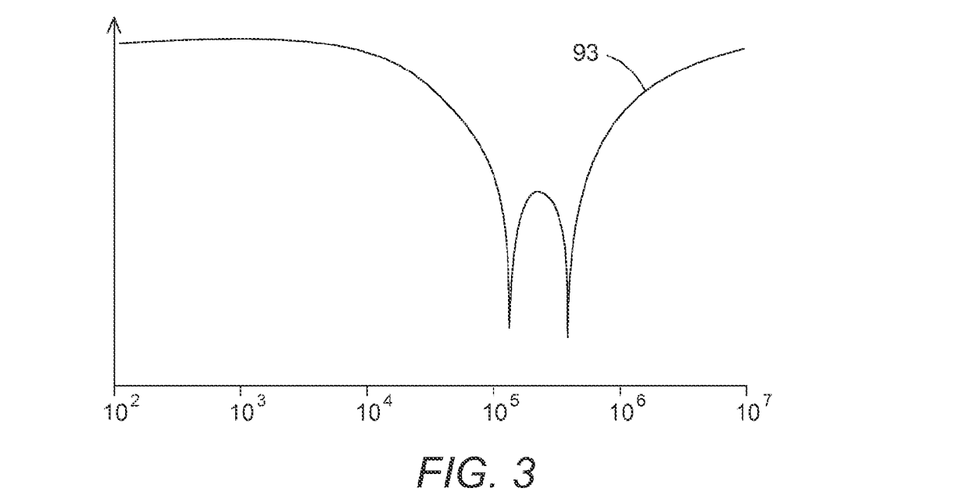
FIG. 3 is a graph having a plot that illustrates in a general manner an example of some signals of the circuit of FIG. 1 in accordance with the present invention.

FIG. 3 is a graph having a plot 93 that illustrates in a general manner an example of the transfer function (H40) of filter 40 and the cutoff frequencies or notches formed by the changed values of the non-limiting example embodiment. The abscissa indicates frequency and the ordinate illustrates one non-limiting example of the value of the magnitude of the transfer function H40 in db. In an embodiment of filter 40, the magnitude of the differential transfer function of filter 40 at low frequencies may be near to substantially 0 dB or 1, which means that a signal having such a frequency will pass substantially without any modification. For an embodiment of filter 40, the magnitude of the differential transfer function of filter 40 at higher frequencies, such as in a non-limiting example embodiment at frequencies near to the chopping frequency and greater, may at first decrease and thereafter it may follow a specific symmetrical double notch shape. In a non-limiting example embodiment, filter 40 may provide an attenuation of approximately 59.2 db at frequencies close to substantially 125 kHz, while the attenuation near substantially 375 kHz may be approximately 61.5 dB. In an embodiment and considering a frequency domain around the chopping frequency, in referring to plot 93, it can be shown that if the chopping frequency shifts, due to certain causes, a minimum attenuation of 40 dB can be obtained between 113.6 kHz and 140 kHz. Another attenuation, such as for example approximately 40 db, around the third harmonic of the chopping frequency, for example approximately 375 kHz, can be obtained for a frequency domain between 334.2 kHz and 412.9 kHz. Frequencies between the two cutoff frequencies, for example between approximately 1.25 kHz and 375 kHz, may be attenuated with more than approximately 31.4 db, and a minimum may result near approximately 215.18 kHz. An example of a fifth harmonic of the chopping frequency, such as for example approximately 625 kHz, may be attenuated with only 23.2 dB. But, since the ripple component at this harmonic is much smaller than those of the previous two odd harmonics, this means that the overall performance of the filter and the changed values is good.

In a non-limiting example embodiment of filter 40, the magnitude of differential transfer function of filter 40 may increase at high frequencies to a value near to substantially 0 db or 1.

It is believed that filter 40 may be formed to provide around 60 dB (or 1,000:1) attenuation for both first and third harmonics of the chopping frequency. Filter 40 may also be formed to provide an acceptable level of performance if the chopping frequency is modified with ±10%. In an embodiment, the acceptable performance may be approximately 40 dB of attenuation. Those skilled in the art will appreciate that a certain tracking behavior may be formed within amplifier 10. For example, oscillator 22 (FIG. 2) may include current generators or current sources that may be formed to include resistors formed from the same type of material or from the same type of structure used for forming the resistors of filter 40. For example, the resistors of the oscillator 22 and the resistors of filter 40 may be formed from polysilicon resistors that have approximately the same resistivity or the same cross-sectional area. Consequently, if value of the resistors of oscillator 22 change (such as for example by temperature variation or by placement on the semiconductor wafer or by process parameter variations) the value of the filter 40 resistors may also change and provide a tracking between the cutoff frequencies and the frequency of clock signals C1 and C2. Thus, in an embodiment, a certain tracking behavior may be built-in within amplifier 10. In an embodiment, the chopping frequency and the cutoff frequencies of the symmetrical passive RC notch filter may be well correlated, as Monte-Carlo simulations have confirmed, and it is believed that, in an embodiment, the chopping frequency and the cutoff frequencies of the symmetrical passive RC notch filter may be well correlated.

Forming filter 40 with two cutoff frequencies or notches may introduce certain series resistances between outputs 35 and 36 of chopping circuit 25 and outputs 80-81 of filter 40. However, the noise generated by these series resistances is divided, from the overall input-referred noise point of view, by the voltage gain of amplifier 85 which means that any noise degradation brought by filter 40 with two cutoff frequencies is quite low. In an embodiment, the value of the voltage gain of amplifier 85 may be between approximately 66 dB and approximately 74 dB in one non-limiting example embodiment, depending on conditions.

Figure 4:
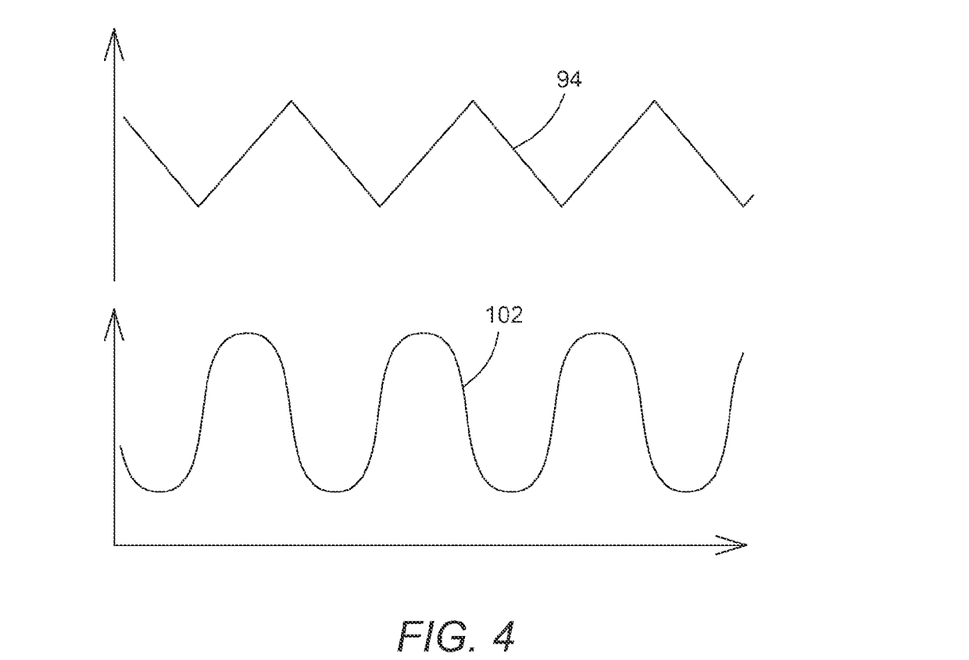
FIG. 4 is a graph having a plot that illustrates in a general manner an example of some other signals of the circuit of FIG. 1 in accordance with the present invention.

FIG. 4 is a graph having a plot 94 that illustrates in a general manner an example of an embodiment of a non-limiting example embodiment of a signal received between inputs 35-36 of filter 40. The abscissa indicates time and the ordinate indicates increasing value of the illustrated signals. A plot 102 illustrates in a general manner an example of a non-limiting example embodiment of output signal Vout. The abscissa indicates time and the ordinate indicates increasing value of the illustrated signal. Plot 94 illustrates that the input signal received by filter 40 may have high magnitude ripple noise. Plot 102 illustrates that output signal Vout on the output of amplifier 10 has minimized ripple noise. In one non-limiting example embodiment of amplifier 10 and filter 40 for non-limiting examples of signals illustrated by plots 94 and 102, amplifier 85 may be configured to have an intrinsic ten milli-volt (10 mV) offset voltage, while the closed loop gain of the non-limiting example embodiment of amplifier 10 may be approximately ten (10). For the non-limiting example embodiment the ripple noise may have a peak-to-peak amplitude of approximately fourteen milli-volts (14 mV), it the output ripple noise shown in the example embodiment of plot 102 may have a peak-to-peak amplitude of approximately one hundred and forty (140) micro-volts. Ripple noise frequency may be the chopping frequency of approximately 125 kHz.

It is believed that filter 40 provides amplifier 10 with reduced ripple over prior art chopper-stabilized operational amplifiers such as for example over prior art chopper stabilized operational amplifiers that used more than two multi-phase clock signals for the amplifier, considering similar or different closed-loop and load conditions.

Figure 5:
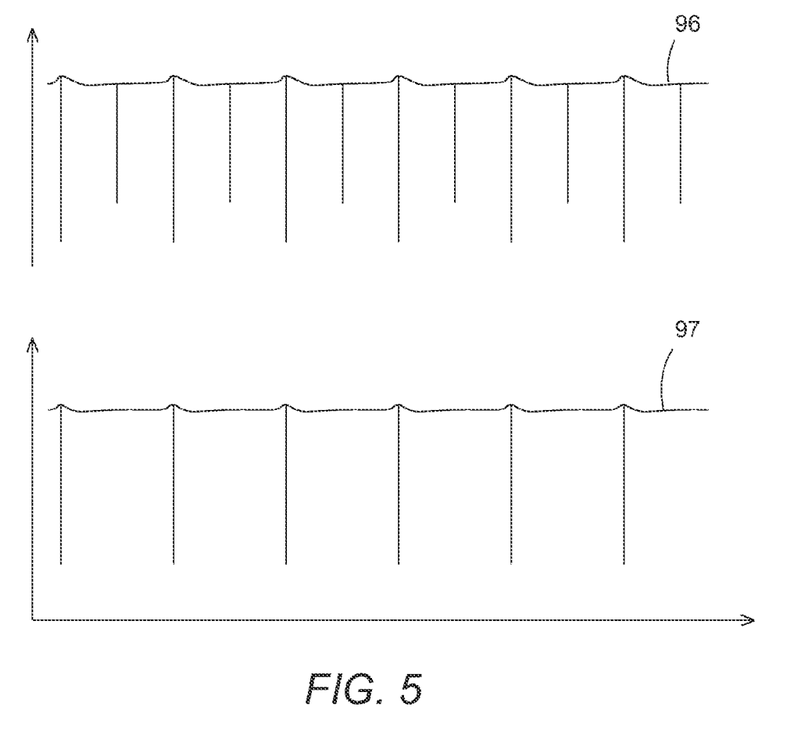
FIG. 5 is a graph having a first plot that illustrates in a general manner glitches found at the output of a prior art circuit, and also includes a second pint that illustrates in a general manner an example of glitches at an output of the circuit of FIG. 1 in accordance with the present invention.

FIG. 5 is a graph having a plot 96 that illustrates in a general manner glitches found at the output of a prior-art chopper-stabilized operational amplifier, and having a plot 97 that illustrates in a general manner an example of glitches at the output of a non-limiting example embodiment of amplifier 10. The abscissa indicates time and the ordinate indicates increasing value of the illustrated signal. The output glitches of plots 96-97 may be 0.003 mV (or 3 micro-volts) peak-to-peak. In the non-limiting example embodiment, both operational amplifiers may be unity-gain configured while having a load of 100 kilo ohms in parallel with 100 picofarads.

For one non-limiting example embodiment of amplifier 85, the offset voltage of amplifier 85 may give certain, even much reduced, 125 kHz ripple on Vout. In an embodiment, a similar offset voltage of amplifier 86 may provide on Vout a DC voltage error value equal with the offset voltage Vos of the operational amplifier itself, times the closed loop gain. A typical Vos value depends on both the gain of the cells and on the circuit and layout techniques used to implement them. It is believed that amplifier 10 could have a typical input offset voltage Vas of plus or minus one (±1) micro-volt, while the minimum/maximum Vas values could be within plus or minus five (±5) micro-volts, over the entire temperature and process drift ranges. These values can be favorable compared with prior-art amplifiers. For a non-limiting embodiment of amplifier 10 that uses a multi-phase clock that has only two clock phases, instead of the four phases for some prior-art amplifiers, amplifier 10 may form only half of the number of glitches in the output signal Vout.

In one non-limiting example embodiment, a closed loop gain of one (1) was considered, together with a load consisting of a ten (10) kilo ohms resistor connected in parallel with a one hundred (100) picofarads capacitor. FIG. 5 illustrates that a non-limiting example embodiment of amplifier 10 has half the number of glitches of prior-art amplifiers. In one example embodiment, amplifier 10 may have, on its output voltage, a glitch at every four micro-seconds (4 μs), while the prior-art amplifier has one at every two micro-second (2 μs). This means that amplifier 10 may have a lower intrinsic noise and also a lower intrinsic current consumption, since fewer transitions will produce fewer glitches within the supply current. Considering such advantages, it is believed that amplifier 10 may be particularly advantages in micro-power integrated circuit applications and/or low noise applications.

Figure 6:
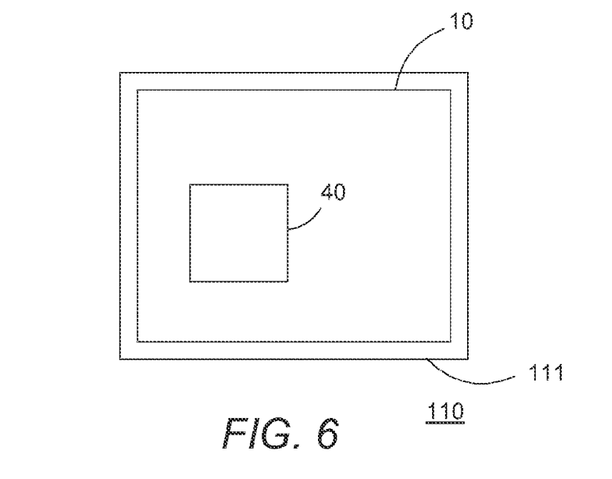
FIG. 6 illustrates an enlarged plan view of a semiconductor device that includes at least a portion of the circuit of FIG. 1 in accordance with the present invention.

FIG. 6 illustrates in a general manner an enlarged plan view of a portion of an embodiment of a semiconductor device or integrated circuit 110 that is formed on a semiconductor die 111. Filter 40 and/or amplifier 10 may be formed on die 111. Die 111 may also include other circuits that are not shown in FIG. 6 for simplicity of the drawing. Filter 40 and device or integrated circuit 110 may be formed on die 111 by semiconductor manufacturing techniques that are well known to those skilled in the art. In one non-limiting example embodiment of filter 40 and amplifier 10 formed on a semiconductor die, the example implementation of amplifier 10 occupied approximately 0.5 square-mm and the non-limiting example embodiment of filter 40 occupied approximately 0.07 square-mm.

From all the foregoing, one skilled in the art can determine that it is desirable to form a chopper-stabilized amplifier having reduced output ripple noise and a reduced offset voltage such as for example by using a novel filtering of the signal generated at the output of the chopper amplifier. An embodiment may include forming a passive symmetrical notch filter.

In one embodiment, multi-phase clock signals may be used that have only two substantially symmetrical clock signals. In an embodiment, no clock signals may be used within the filter section of the symmetrical notch filter. It is believed that the number of glitches within the output signal is reduced. An embodiment may include the use of a symmetrical passive PC (Resistor-Capacitor) notch filter with two-cutoff frequencies.

An embodiment of filter 40 is formed to be symmetrical. In one method of forming the symmetrical notch filter, may be conceptually thought of as a passive RC twin-T filter may be mirrored related to GND and merged at the identical series connected elements. Another symmetrical passive RC notch filter may be connected to the passive RC twin-T filter and in series therewith.

Those skilled in the art will appreciate that an embodiment of the symmetrical passive RC notch filter may include—a first path including a first resistor coupled between the first input terminal and a first conductor, a second resistor coupled between the first conductor and a second conductor, a third resistor coupled between the second conductor and a third conductor, and a fourth resistor coupled between the third conductor and the second output terminal.

An embodiment of filter may include a second path having a fifth resistor coupled between the second input terminal and a fourth conductor, a sixth resistor coupled between the fourth conductor and a fifth conductor, a seventh resistor coupled between the fifth conductor and a sixth conductor, and an eighth resistor coupled between the sixth conductor and the second output terminal.

In an embodiment, filter may include a third path having a first capacitor coupled between the second input terminal and a seventh conductor, a second capacitor coupled between the seventh conductor and the fifth conductor, a third capacitor coupled between the fifth conductor and an eighth conductor, and a fourth capacitor coupled between the eighth conductor and the second output terminal, An embodiment of filter may include a fourth path having a fifth capacitor coupled between the first input terminal and a ninth conductor, a sixth capacitor coupled between the ninth conductor and the second conductor, a seventh capacitor coupled between the second conductor and a tenth conductor, and an eighth capacitor coupled between the tenth conductor and the first output terminal, An embodiment of filter may also include at least one of a ninth resistor coupled between the seventh conductor and the ninth conductor, a tenth resistor coupled between the eighth conductor and the tenth conductor, a ninth capacitor coupled between the first conductor and the fourth conductor, and a tenth capacitor coupled between the third conductor and the sixth conductor.

Those skilled in the art will appreciate that an embodiment of a chopper-stabilized amplifier may comprise:

a first operational transconductance amplifier, such as for example amplifier 85;

a first chopper circuit, such as for example circuit 15, coupled to an input of the first operational transconductance amplifier for chopping an input signal and applying a chopped input signal to the input of the first operational transconductance amplifier;

a second chopper circuit, such as for example circuit 25, coupled to an output of the first operational transconductance amplifier for chopping an output signal produced by the first operational transconductance amplifier; and a symmetrical passive RC notch filter, such as for example filter 40, with two cutoff frequencies having an input coupled to an output of the second chopper circuit to filter a chopped output signal produced by the second chopper circuit to notch filter ripple voltages received from the output of the second chopper circuit.

In an embodiment, the chopper-stabilized amplifier may also include that a chopper switching frequency may be correlated with at least a first cutoff frequency of the two cutoff frequencies of the symmetrical passive RC notch filter by using a current-driven oscillator and a bias circuit that both use a same type of resistor as the symmetrical passive RC notch filter itself.

An embodiment may include that the two cutoff frequencies of the symmetrical passive RC notch filter are correlated to approximately the chopping frequency and approximately a third harmonic of the chopping frequency.

Another embodiment may include that the two cutoff frequencies of the symmetrical passive RC notch filter may be correlated to approximately the chopping frequency and approximately a fifth harmonic of the chopping frequency.

An embodiment may include configuring the chopper-stabilized amplifier to use no more than two complementary clock signals, both having substantially fifty percent duty cycles and having substantially simultaneous and opposite transitions wherein the first and second chopper circuits are configured to operate with the two complementary clock signals.

In an embodiment, the symmetrical passive RC notch filter may include first and second inputs, wherein the symmetrical passive RC notch filter includes first and second outputs, and wherein the symmetrical passive RC notch filter may also include:

a first path including a first resistor, such as for example a resistor 42, coupled between the first input, such as for example input 35, and a first node, such as for example node 46, and a second resistor, such as for example resistor 43, coupled between the first node and a second node, such as for example node 60;

a second path including a first capacitor, such as for example capacitor 44, coupled between the first input and a third node, such as for example node 54, and a second capacitor, such as for example capacitor 45, coupled between the third node and the second node;

a third path including a third resistor, such as for example resistor 50, coupled between the second input, such as for example input 36, and a fourth node, such as for example node 47, and a fourth resistor, such as for example resistor 51, coupled between the fourth node and a fifth node, such as for example node 61;

a fourth path including a third capacitor, such as for example capacitor 52, coupled between the second input and a sixth node, such as for example node 55, and a fourth capacitor, such as for example capacitor 53, coupled between the sixth node and the fifth node;

a fifth resistor, such as for example resistor 41, coupled between the third node and the sixth node and a fifth capacitor, such as for example capacitor 48, coupled between the first node and the fourth node.

Another embodiment may also include, a fifth path including a sixth resistor, such as for example resistor 63, coupled between the second node and a seventh node, such as for example node 67, and a seventh resistor, such as for example resistor 64, coupled between the seventh node and the first output, such as for example output 80;

a sixth path including a sixth capacitor, such as for example capacitor 65, coupled between the second node and an eighth node, such as for example node 77, and a seventh capacitor, such as for example capacitor 66, coupled between the eighth node and the first output;

a seventh, path including an eighth resistor, such as for example resistor 72, coupled between the fifth node and a ninth node, such as for example node 68, and a ninth resistor, such as for example resistor 73, coupled between the ninth node and the second output, such as for example output 81;

an eighth path including an eighth capacitor, such as for example capacitor 74, coupled between the fifth node and a tenth node, such as for example node 78, and a ninth capacitor, such as for example capacitor 75, coupled between the tenth node, such as for example node 78, and the second output; and a tenth capacitor, such as for example capacitor 69, coupled between the seventh node and the ninth node and a tenth resistor, such as for example resistor 62, coupled between the eighth, node and the tenth node.

An embodiment may also include a clock generation circuit having a current driven oscillator and a bias circuit that both include resistors formed from a same type of semiconductor material.

Another embodiment may include a second operational transconductance amplifier, such as for example amplifier 83, having an input coupled to an output of the symmetrical passive RC notch filter, a third operational transconductance amplifier, such as for example amplifier 87, having an input coupled to an output of the second operational transconductance amplifier, and a fourth operational transconductance amplifier, such as for example amplifier 86, having an input coupled to receive the input signal and an output coupled to the output of the second operational transconductance amplifier.

Another embodiment may also include a first compensation capacitor, such as for example capacitor 92, coupled between a first input of the symmetrical passive RC notch filter and an output, such as for example output 95, of the chopper stabilized amplifier;

a second compensation capacitor, such as for example capacitor 91, coupled between the input and an output of the third operational transconductance amplifier, such as for example amplifier 87; and a third compensation capacitor, such as for example capacitor 39, coupled between the first input, such as for example input 35, and a second input, such as for example input 36, of the symmetrical passive RC notch filter.

An embodiment may also include a forth compensation capacitor, such as for example one of capacitors 37 or 38, coupled between a first input, such as for example one of inputs 35 or 36, of the symmetrical passive AC notch filter and a ground node; and a fifth compensation capacitor, such as for example the other one of capacitors 37 or 38, coupled between a second input, such as for example the other one of inputs 35 or 36, of the symmetrical passive RC notch filter and the ground node.

Another embodiment may also include a first compensation capacitor, such as for example capacitor 92, coupled between a first output, such as for example output 80, of the symmetrical passive RC notch filter and an output, such as for example output 95, of the chopper-stabilized amplifier;

a second compensation capacitor, such as for example capacitor 91, coupled between the output and an input of the third operational transconductance amplifier, such as for example amplifier 87; and a third compensation capacitor, such as for example capacitor 39, coupled between outputs, such as for example outputs 80 and 81, of the symmetrical passive RC notch filter.

An embodiment may also include, a forth compensation capacitor, such as for example one of capacitors 37 or 38, coupled between a first output, such as for example one of outputs 80 or 81, of the symmetrical passive RC notch filter and a ground node; and a fifth compensation capacitor, such as for example the other one of capacitors 37 or 38, coupled between a second output, such as for example the other one of outputs 80 or 81, of the symmetrical passive RC notch filter and the ground node.

Those skilled in the art will, appreciate that a method of forming a chopper-stabilized amplifier may comprise:

configuring the chopper-stabilized amplifier, such as for example amplifier 10, to chop a signal at a first frequency no produce a chopped signal; and configuring a symmetrical passive RC notch filter, such as for example filter 40, to have at least two cutoff frequencies including a first cutoff frequency and a second cutoff frequency wherein the first cutoff frequency is substantially near the first frequency and the second cutoff frequency is a harmonic of the first frequency.

An embodiment of the method may also include forming the second cutoff frequency to be a third harmonic of the first frequency.

Those skilled in the art will also appreciate that a method of forming a chopper-stabilized amplifier may comprise:

forming a symmetrical passive RC notch filter, such as for example filter 40, to have two cutoff frequencies;

forming a first section, such as for example section 57, of the symmetrical passive RC notch filter with a first plurality of signal paths including a first plurality of input signal paths, such as for example a plurality of payouts from input 35, coupled to a first input, such as for example input 35, of the first section and a second plurality of input signal paths, such as for example from input 36, coupled to a second input, such as for example input 36, of the first section;

configuring the first plurality of input signal paths to include a first plurality of resistors, such as for example resistors 42 and 43, and a first plurality of capacitors, such as for example capacitors 44 and 45; and configuring the second plurality of input signal paths to include a second plurality of resistors, such as for example resistors 50 and 51, and a second plurality of capacitors, such as for example resistors 52 and 53.

An embodiment may include forming a second section, such as for example section 58, of the symmetrical passive RC notch filter coupled to an output of the first section and forming the second section with a second plurality of signal paths including a third plurality of input signal paths coupled to a first output, such as for example output 60, of the first section and a fourth plurality of input signal paths coupled to a second output, such as for example output 61, of the first section.

Another embodiment may include configuring the third plurality of input signal paths to include a third plurality of resistors, such as for example resistors 63 and 64, and a third plurality of capacitors, such as for example capacitor 65 and 66; and configuring the fourth plurality of input signal paths to include a fourth plurality of resistors, such as for example resistor 72 and 73, and a fourth plurality of capacitors, such as for example capacitor 74 and 75.

An embodiment may also include configuring the first plurality of resistors to include at least first and second series coupled resistors, such as for example resistors 42 and 43, coupled between a first input, such as for example input 35, of the symmetrical passive RC notch filter and a first output, such as for example output 80, of the symmetrical passive RC notch filter; and configuring the second plurality of resistors to include at least third and fourth series coupled resistors, such as for example resistors 50 and 51, coupled between a second input, such as for example input 36, of the symmetrical, passive RC notch filter and a second output, such as for example output 81, of the symmetrical passive RC notch filter.

In another embodiment, the method may also include forming the symmetrical passive RC notch filter to be devoid of a clock signal used to operate elements of the symmetrical passive RC notch filter.

In view of all of the above, it is evident that a novel device and method is disclosed. Included, among other features, is forming a notch filter that has two cut-off frequencies. An embodiment includes forming amplifier 10 that includes filter 40 to operate with only two clock signals. In an embodiment, symmetrical passive notch filter is configured to include two cutoff frequencies. In an embodiment, a first cutoff frequency may be a chopper frequency and a second cutoff frequency may be a harmonic of the chopper frequency. The two cut-off frequencies may be correlated with the chopper frequency. An embodiment may include that the chopping frequency may be correlated with the cut-off frequencies by using a current-driven oscillator and a bias circuit that both use the same type of resistor as the resistors in the filter.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. Although compensation capacitors 37-39 and 92 are illustrated as connected to inputs 35 and 36 of filter 40, these compensation capacitors may be connected to outputs 80 and 81 in other embodiments. In some embodiments, one or more of capacitors 37-39 or 90 may be omitted. Filter 40 may be used in other applications other than to filter the output of a chopper amplifier. For example, filter 40 may be used to filter signals received from portions of a switching voltage regulator.

As the claims hereinafter reflect, inventive aspects may lie in less than all features of a single foregoing disclosed embodiment. Thus, the hereinafter expressed claims are hereby expressly incorporated into this Description portion of the Application, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A chopper-stabilized amplifier comprising:
   a first operational transconductance amplifier;
   a first chopper circuit coupled to an input of the first operational transconductance amplifier for chopping an input signal and applying a chopped input signal to the input of the first operational transconductance amplifier;
   a second chopper circuit coupled to an output of the first operational transconductance amplifier for chopping an output signal produced by the first operational transconductance amplifier; and
   a symmetrical passive RC notch filter with two cutoff frequencies having an input coupled to an output of the second chopper circuit to filter a chopped output signal produced by the second chopper circuit to notch filter ripple voltages received from the output of the second chopper circuit
   wherein the symmetrical passive RC notch filter includes first and second inputs, wherein the symmetrical passive RC notch filter includes first and second outputs, and wherein the symmetrical passive RC notch filter includes:
   a first path including a first resistor coupled between the first input and a first node, and a second resistor coupled between the first node and a second node;
   a second path including a first capacitor coupled between the first input and a third node, and a second capacitor coupled between the third node and the second node;
   a third path including a third resistor coupled between the second input and a fourth node, and a fourth resistor coupled between the fourth node and a fifth node;
   a fourth path including a third capacitor coupled between the second input and a sixth node, and a fourth capacitor coupled between the sixth node and the fifth node;
   a fifth resistor coupled between the third node and the sixth node and a fifth capacitor coupled between the first node and the fourth node.

2. The chopper-stabilized amplifier of claim 1 wherein a chopper switching frequency is correlated with at least a first cutoff frequency of the two cutoff frequencies of the symmetrical passive RC notch filter by using a current-driven oscillator and a bias circuit that both use a same type of resistor as the symmetrical passive RC notch filter itself.

3. The chopper-stabilized amplifier of claim 2 wherein the two cutoff frequencies of the symmetrical passive RC notch filter are correlated to approximately the chopping frequency and approximately a third harmonic of the chopping frequency.

4. The chopper-stabilized amplifier of claim 2 wherein the two cutoff frequencies of the symmetrical passive RC notch filter are correlated to approximately the chopping frequency and approximately a fifth harmonic of the chopping frequency.

5. The chopper-stabilized amplifier of claim 1 including configuring the chopper-stabilized amplifier to use no more than two complementary clock signals, both having substantially fifty percent duty cycles and having substantially simultaneous and opposite transitions wherein the first and second chopper circuits are configured to operate with the two complementary clock signals.

6. The chopper-stabilized amplifier of claim 1 further including, a fifth path including a sixth resistor coupled between the second node and a seventh node, and a seventh resistor coupled between the seventh node and the first output;

a sixth path including a sixth capacitor coupled between the second node and an eighth node, and a seventh capacitor coupled between the eighth node and the first output;

a seventh path including an eighth resistor coupled between the fifth node and a ninth node, and a ninth resistor coupled between the ninth node and the second output;

an eighth path including an eighth capacitor coupled between the fifth node and a tenth node, and a ninth capacitor coupled between the tenth node and the second output; and a tenth capacitor coupled between the seventh node and the ninth node and a tenth resistor coupled between the eighth node and the tenth node.

7. The chopper-stabilized amplifier of claim 1 including a clock generation circuit having a current driven oscillator and a bias circuit that both include resistors formed from a same type of semiconductor material.

8. The chopper-stabilized amplifier of claim 1 further including a second operational transconductance amplifier having an input coupled to an output of the symmetrical passive RC notch filter, a third operational transconductance amplifier having an input coupled to an output of the second operational transconductance amplifier, and a fourth operational transconductance amplifier having an input coupled to receive the input signal and an output coupled to the output of the second operational transconductance amplifier.

9. The chopper-stabilized amplifier of claim 8 further including:
a first compensation capacitor coupled between the first input of the symmetrical passive RC notch filter and an output of the chopper stabilized amplifier;
a second compensation capacitor coupled between the input and an output of the third operational transconductance amplifier; and
a third compensation capacitor coupled between the first input and the second input of the symmetrical passive RC notch filter.

10. The chopper-stabilized amplifier of claim 9 further including:
a forth compensation capacitor coupled between the first input of the symmetrical passive RC notch filter and a ground node; and
a fifth compensation capacitor coupled between the second input of the symmetrical passive RC notch filter and the ground node.

11. The chopper-stabilized amplifier of claim 8 further including:
a first compensation capacitor coupled between a first output of the symmetrical passive RC notch filter and an output of the chopper-stabilized amplifier;
a second compensation capacitor coupled between the output and an input of the third operational transconductance amplifier; and
a third compensation capacitor coupled between outputs of the symmetrical passive RC notch filter.

12. The chopper-stabilized amplifier of claim 11 further including:
a forth compensation capacitor coupled between a first output of the symmetrical passive RC notch filter and a ground node; and a fifth compensation capacitor coupled between a second output of the symmetrical passive RC notch filter and the ground node.

13. A method of forming a chopper-stabilized amplifier comprising:
configuring the chopper-stabilized amplifier to chop a signal at a first frequency to produce a chopped signal; and
configuring a symmetrical passive RC notch filter to have at least two cutoff frequencies including a first cutoff frequency and a second cutoff frequency wherein the first cutoff frequency is substantially near the first frequency and the second cutoff frequency is a harmonic of the first frequency and
wherein the symmetrical passive RC notch filter includes:
a first path including a first resistor coupled between the first input and a first node, and a second resistor coupled between the first node and a second node;
a second path including a first capacitor coupled between the first input and a third node, and a second capacitor coupled between the third node and the second node;
a third path including a third resistor coupled between the second input and a fourth node, and a fourth resistor coupled between the fourth node and a fifth node.

14. The method of claim 13 including forming the second cutoff frequency to be a third harmonic of the first frequency.

15. A method of forming a chopper-stabilized amplifier comprising:
forming a symmetrical passive RC notch filter to have two cutoff frequencies;
forming a first section of the symmetrical passive RC notch filter with a first plurality of signal paths including a first plurality of input signal paths coupled to a first input of the first section and a second plurality of input signal paths coupled to a second input of the first section;
configuring the first plurality of input signal paths to include a first plurality of resistors and a first plurality of capacitors;
configuring the second plurality of input signal paths to include a second plurality of resistors and a second plurality of capacitors; and
forming a second section of the symmetrical passive RC notch filter coupled to an output of the first section and forming the second section with a second plurality of signal paths including a third plurality of input signal paths coupled to a first output of the first section and a fourth plurality of input signal paths coupled to a second output of the first section.

16. The method of claim 15 further including configuring the third plurality of input signal paths to include a third plurality of resistors and a third plurality of capacitors; and
configuring the fourth plurality of input signal paths to include a fourth plurality of resistors and a fourth plurality of capacitors.

17. The method of claim 15 further including configuring the first plurality of resistors to include at least first and second series coupled resistors coupled between a first input of the symmetrical passive RC notch filter and a first output of the symmetrical passive RC notch filter; and
configuring the second plurality of resistors to include at least third and fourth series coupled resistors coupled between a second input of the symmetrical passive RC notch filter and a second output of the symmetrical passive RC notch filter.

18. The method of claim 15 further including forming the symmetrical passive RC notch filter to be devoid of a clock signal used to operate elements of the symmetrical passive RC notch filter;

passive RC notch filter are correlated to approximately the chopping frequency and approximately a fifth harmonic of the chopping frequency.

* * * * *